(12) United States Patent
Zhang et al.

(10) Patent No.: US 8,835,965 B2
(45) Date of Patent: Sep. 16, 2014

(54) APPLICATION OF SEMICONDUCTOR QUANTUM DOT PHOSPHORS IN NANOPILLAR LIGHT EMITTING DIODES

(71) Applicant: The Penn State Research Foundation, University Park, PA (US)

(72) Inventors: Fan Zhang, State College, PA (US); Jian Xu, State College, PA (US); Suzanne Mohney, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 13/744,526

(22) Filed: Jan. 18, 2013

(65) Prior Publication Data

US 2013/0200334 A1   Aug. 8, 2013

Related U.S. Application Data

(60) Provisional application No. 61/587,884, filed on Jan. 18, 2012.

(51) Int. Cl.
| | | |
|---|---|---|
| H01L 33/00 | (2010.01) | |
| H01L 21/00 | (2006.01) | |
| H01L 33/04 | (2010.01) | |
| H01L 33/20 | (2010.01) | |
| H01L 33/50 | (2010.01) | |
| H01L 33/06 | (2010.01) | |
| B82Y 99/00 | (2011.01) | |
| B82Y 10/00 | (2011.01) | |
| B82Y 20/00 | (2011.01) | |

(52) U.S. Cl.
CPC ............... *H01L 33/04* (2013.01); *H01L 33/06* (2013.01); *B82Y 99/00* (2013.01); *B82Y 10/00* (2013.01); *H01L 33/20* (2013.01); *H01L 33/502* (2013.01); *B82Y 20/00* (2013.01)
USPC .............................................. 257/98; 438/22

(58) Field of Classification Search
USPC ............... 257/13, 79–103, 918, 40, 642–643, 257/759; 438/22–47, 69, 493, 503, 507, 438/956
See application file for complete search history.

(56) References Cited

U.S. PATENT DOCUMENTS

| | | | |
|---|---|---|---|
| 6,847,052 B2 | 1/2005 | Fan et al. | |
| 6,967,346 B2 | 11/2005 | Chien et al. | |

(Continued)

FOREIGN PATENT DOCUMENTS

| | | |
|---|---|---|
| CN | 1595670 A | 3/2005 |
| GB | 2409334 A | 6/2005 |

(Continued)

OTHER PUBLICATIONS

Achermann, M., et al., "Energy-transfer pumping of semiconductor nanocrystals using an epitaxial quantum well," Nature, 429, 642-646 (Jun. 10, 2004).

(Continued)

*Primary Examiner* — Julio J Maldonado
*Assistant Examiner* — Moin Rahman
(74) *Attorney, Agent, or Firm* — Gifford, Krass, Sprinkle, Anderson & Citkowski, P.C.

(57) ABSTRACT

A quantum well-based p-i-n light emitting diode is provided that includes nanopillars with an average linear dimension of between 50 nanometers and 1 micron. The nanopillars include a laminar layer of quantum wells capable of non-radiative energy transfer to quantum dot nanocrystals. Quantum dot-Quantum well coupling through the side walls of the nanopillar-configured LED structure achieves a close proximity between quantum wells and quantum dots while retaining the overlying contact electrode structures. A white LED with attractive properties relative to conventional incandescent and fluorescence lighting devices is produced.

19 Claims, 4 Drawing Sheets

(56) References Cited

U.S. PATENT DOCUMENTS

| | | | |
|---|---|---|---|
| 7,005,667 | B2 | 2/2006 | Chen et al. |
| 7,217,959 | B2 | 5/2007 | Chen |
| 7,242,030 | B2 | 7/2007 | Wang et al. |
| 7,396,696 | B2 | 7/2008 | Kim et al. |
| 7,989,832 | B2 | 8/2011 | Kim |
| 2006/0163560 | A1 | 7/2006 | Choi |
| 2008/0303018 | A1 | 12/2008 | Kim et al. |
| 2009/0001395 | A1 | 1/2009 | Chung et al. |
| 2009/0039360 | A1 | 2/2009 | Cok et al. |
| 2009/0212698 | A1 | 8/2009 | Bailey |
| 2009/0289226 | A1 | 11/2009 | Naum et al. |
| 2010/0006775 | A1 | 1/2010 | Gibson |
| 2010/0264400 | A1 | 10/2010 | Kim |
| 2011/0156088 | A1 | 6/2011 | Moon et al. |
| 2011/0220871 | A1* | 9/2011 | Kamikawa et al. ............ 257/13 |
| 2012/0112165 | A1* | 5/2012 | Charlton et al. ............... 257/21 |
| 2012/0132888 | A1* | 5/2012 | Kwak et al. .................... 257/13 |
| 2012/0164797 | A1* | 6/2012 | Lowenthal et al. ........... 438/127 |
| 2013/0028282 | A1* | 1/2013 | Murty ...................... 372/50.11 |
| 2013/0279531 | A1* | 10/2013 | Murty ...................... 372/50.11 |

FOREIGN PATENT DOCUMENTS

| | | | |
|---|---|---|---|
| KR | 1020040098798 | A | 11/2004 |
| KR | 100819337 | B1 | 4/2008 |
| KR | 1020090026508 | A | 3/2009 |
| KR | 1020090047034 | A | 5/2009 |
| KR | 1020090064079 | A | 6/2009 |
| WO | WO-2007098451 | A1 | 8/2007 |
| WO | WO-2009005751 | A1 | 1/2009 |
| WO | WO-2010146390 | A2 | 12/2010 |

OTHER PUBLICATIONS

Chen, H., et al., "InGaN—CdSe—ZnSe Quantum Dots White LEDs", IEEE Photonics Tech. Lett. 18(1), 193-195 (Jan. 1, 2006).

Achermann, M., et al., "Nanocrystal-Based Light-Emitting Diodes Utilizing High-Efficiency Nonradiative Energy Transfer for Color Conversion," Nano Lett., vol. 6, No. 7, 1396-1400 (2006).

Kershaw, Steve V., et al., "Development of IR-Emitting Colloidal II-VI Quantum-Dot Materials," IEEE Journal of Selected Topics in Quantum Electronics, vol. 6, No. 3, 534-543 (May/Jun. 2000).

Sullivan, Seth-Coe, et al., "Tuning the performance of hybrid organic/inorganic quantum dot light-emitting devices," Organic Electronics, 4, 123-130 (2003).

Steckel, Jonathan S., et al., "Color-Saturated Green-Emitting QD-LEDs", Angew. Chem. Int. Ed. 45, 5796-5799 (2006).

Steckel, Jonathan S., et al., "Blue Luminescence from (CdS)ZnS Core-Shelll Nanocrystals," Angew. Chem. Int. Ed., 43, 2154-2158 (2004).

Sun, Qingjiang et al., "Bright, multicoloured light-emitting diodes based on quantum dots," Nature photonics, vol. 1, 717-722 (Dec. 2007).

Nizamoglu, Sedat, et al., "Green/yellow solid-state lighting via radiative and non-radiative transfer involving colloidal semiconductor nanocrystals," IEEE Journal of Special Topics in Quantum Electronics, vol. 15, No. 4, 1163-1170 (Jul./Aug. 2009).

Lu, Siyuan, et al., "Nonradiative Resonant Excitation Transfer from Nanocrystal Quantum Dots to Adjacent Quantum Channels," Nano Lett., vol. 7, No. 11, 3443-3451 (2007).

Chanyawadee, S., et al., "Increased Color-Conversion Efficiency in Hybrid Light-Emitting Diodes utilizing Non-Radiative Energy Transfer," Advanced Materials, 22, 1-15 (2010).

Lee, Ya-Ju, et al., "High output power density from GaN-based two-dimensional nanorod light-emitting diode arrays," Applied Physics Letters, 94, 141111, 1-4 (2009).

Hoheisel, M., et al., "Microstructure and etching properties of sputtered indium-tin oxide (ITO)", Phys. Stat. Sol., (a) 123, 461-472 (1991).

Zhang, Chunfeng, et al., "Two-Photon Pumped Lasing from Colloidal Nanocrystal Quantum Dots," Optics Lett., vol. 33, No. 21, 2437-2439 (Nov. 1, 2008).

Zhang, Chunfeng, et al., "Quantum Efficiency of Stimulated Emission in Colloidal Semiconductor Nanocrystal Quantum Dots," Phys. Rev. B 80, 035333, 1-6 (2009).

Guo, Zeng-Shan, et al., "CdSe/ZnS Nanoparticle Composites with Amine-Functionalized Polyfluorene Derivatives for Polymeric Light-Emitting Diodes: Synthesis, Photophysical Properties, and the Electroluminesscent Performance," Macromolecules, 2010, 43, 1860-1866.

Nizamoglu, Sedat, et al., "White light generation using CdSe/ZnS core-shell nanocrystals hybridized with InGaN/GaN light emitting diodes," Nanotechnology, ISSN 0957-4484, vol. 18, No. 6, 065709, 1-5 (Feb. 14, 2007) Institute of Physics Publishing.

Nizamoglu, Sedat, et al., "Excitation resolved color conversion of CdSe/ZnS core/shell quantum dot solids for hybrid white light emitting diodes," Journal of Applied Physics, 105, 083112, 1-5 (2009) American Institute of Physics.

PCT/US2013/022171, International Search Report and Written Opinion 1-11 (May 15, 2013).

\* cited by examiner

APPLICATION OF SEMICONDUCTOR QUANTUM DOT PHOSPHORS IN NANOPILLAR LIGHT EMITTING DIODES

REFERENCE TO RELATED APPLICATIONS

This application claim priority from U.S. Provisional Application Ser. No. 61/587,884 filed Jan. 18, 2012; the contents of which are hereby incorporated by reference.

STATEMENT OF GOVERNMENT SUPPORT

This invention was made with government support under Grant No. ECCS0824186, awarded by the National Science Foundation. The Government has certain rights in the invention.

FIELD OF THE INVENTION

The present invention relates in general to a light emitting diode (LED) and in particular to a white light LED based on semiconductor quantum dots (QDs) used as phosphors in nanopillar LEDs.

BACKGROUND OF THE INVENTION

White light emitting diode (LED) based solid-state lighting is commanding much attention worldwide for its promise of energy savings compared to incandescent and even compact fluorescent lighting. The energy efficiency, longevity, and material usage in manufacture are all attributes that favor white LED technology, yet technical problems persist. The predominant white LED technology involves the employment of high quantum efficiency ($\eta \geq 60\%$) blue InGaN quantum well (QW) LEDs and the down conversion of blue radiation to yellow/green and red for white light generation. $Y_3Al_5O_{12}:Ce^{3+}$ and $Eu^{2+}$ doped nitridosilicates have been coated onto the InGaN QW LED as yellow/green and red phosphors such that trichromatic "cold white light" is produced by mixing red, yellow, green, and blue emission in the LED output.

There are, nevertheless, a number of limits on the performance of those white LEDs due to the phosphor conversion scheme employed. Since the existing red, yellow, and green phosphors have different chemical compositions, it is difficult to control the granule size and to mix and deposit uniform multi-phosphor films. Also, the different aging behavior of the multiple phosphor species often makes the device performance unstable in terms of the overall wavelength output. Current white LED lamps also manifest this phosphor aging differential as a shorter than desirable lamp operation lifetime. A more fundamental limit on the efficiency of the phosphor conversion white LEDs, however, lies in the multi-step "down conversion" scheme: high energy, blue photons produced by InGaN QW LEDs have to be absorbed by the phosphors first, and then, via impurity-level assisted transitions, are converted to low energy, long wavelength photons with a one-to-one correspondence. This process loses a significant portion of the photon energy to lattice vibrations (heat) in the phosphor media as a non-radiative conversion and is also limited by electron system crossings between singlet and triplet quantum states. The energy loss in the down-conversion process will, by itself, set the ultimate quantum efficiency of white LEDs below 65%.

Colloidal compound quantum dots (QDs) have been introduced to the white LED technology as a new family of phosphor materials with many superior properties. Due to strong quantum confinement, semiconductor QDs, such as core/shell CdSe/(Zn,Cd)S QDs, are characterized by sharp exciton absorption spectral features, extremely high luminescence efficiency (~90-95%), and size tunable emission color spanning the entire visible spectrum. QDs of the same chemical composition and different size can therefore be employed to provide multiple spectral components in white LED output, with improved color quality and aging performance. The most significant potential of QD phosphors lies in the recent discovery that there exists a path for indirect injection of electron hole pairs into QDs (for radiative recombination and thus band edge emission from QDs) by noncontact, nonradiative energy transfer from a proximal InGaN quantum well (QW).(1) The direct, non-radiative energy transfer path is considered to be the consequence of dipole-dipole interactions associated with QW-QD coupling and the extremely fast intraband relaxation in colloidal QDs (subpicosecond time scales). As indirect injection of electron hole pairs is fundamentally different from the traditional multi-step "down conversion" fluorescence scheme described previously and operative in traditional phosphors and removes several of the intermediate steps involved in color conversion, this approach has the prospect of eliminating energy losses associated with the steps and increasing the fundamental limit of efficiency.

As promising as the indirect injection of electron hole pairs into QD approach appears to be, it has to-date met with limit success. In one report, Chen et al. has demonstrated white LEDs by housing an. InGaN blue LED chip in a silicon resin doped with green and red emitting CdSe/CdS. Since the QDs were physically separated from the emissive QWs in the LED chip, no QW-QD coupling was possible. A low efficiency of 7.2 lm/W was recorded. (2).

In another study, Achermann et al. observed high efficiency color conversion in an electrically pumped light emitting diode (LED) using non-radiative energy transfer between an InGaN/GaN QW and a monolayer of CdSe/ZnS QDs.(3) Spectroscopic measurements revealed that 13% of the radiative power of the QW was transferred almost loss free to red emission from the QDs when the QW and QDs were located in close proximity to each other. The viability of this work was limited in producing an actual LED device owing to the difficulty in resolving the inherent conflict between the need for close proximity of the QW and QDs and also the need for a sufficiently thick electrical contact layer with a low resistance for LED operation. In addition, the energy fraction (13%) channeled between the QW and QDs is still too low for viable device formation to leverage the benefits of white LEDS relative to conventional lighting devices. These experimental devices with weak QD phosphor emission compared to the bright blue radiation from the InGaN QW remain impractical for usage.

Thus, there exists a need for quantum dots with varied emission colors coupled to an LED emitter that promotes efficient nonradiative energy transfer therebetween to achieve a practical white LED with low energy consumption. These also exists a need for a QW-QD white LED that is compatible with the presence of a bulk electrical contact layer.

SUMMARY OF THE INVENTION

A quantum well-based p-i-n light emitting diode is provided that includes nanopillars have a mean nanopillar average linear dimension of between 50 nanometers and 1 micron. The nanopillars include a laminar layer of quantum wells (QWs) capable of non-radiative energy transfer to quantum dot nanocrystals (QDs) to complete a p-i-n or n-i-p LED structure with emissive characteristic of the quantum dots.

QD-QW coupling through the side walls of the nanopillar-configured LED structure is employed to achieve a close proximity between quantum wells and quantum dots to achieve efficient non-radiative transfer while retaining the overlying contact electrode structures with dimensions adjustable to desired thicknesses for improved efficiency. The quantum dot semiconductor nanoparticles contacting the nanopillars through the sidewalls of the nanopillars overcomes the physical limitations encountered in the prior art laminar structures to yield a white LED with attractive properties relative to conventional incandescent and fluorescence lighting devices. Spectral emission colors from the QDs are tuned through controlling the size, composition, or both of the QDs in contact with the nanopillars.

A GaN LED structure with an InGaN layer is etched to form nanopillars. With contact between the nanopillar sidewalls and chalcogenide based QDs, an efficient LED is produced with emission discerned by a normal human eye as white in color.

BRIEF DESCRIPTION OF THE DRAWINGS

The present invention is further detailed with reference to the following figures. These figures are not intended to be a limitation on the scope of the invention, but rather to illustrate specific aspects of the invention.

DETAILED DESCRIPTION OF THE INVENTION

Figure 1A:
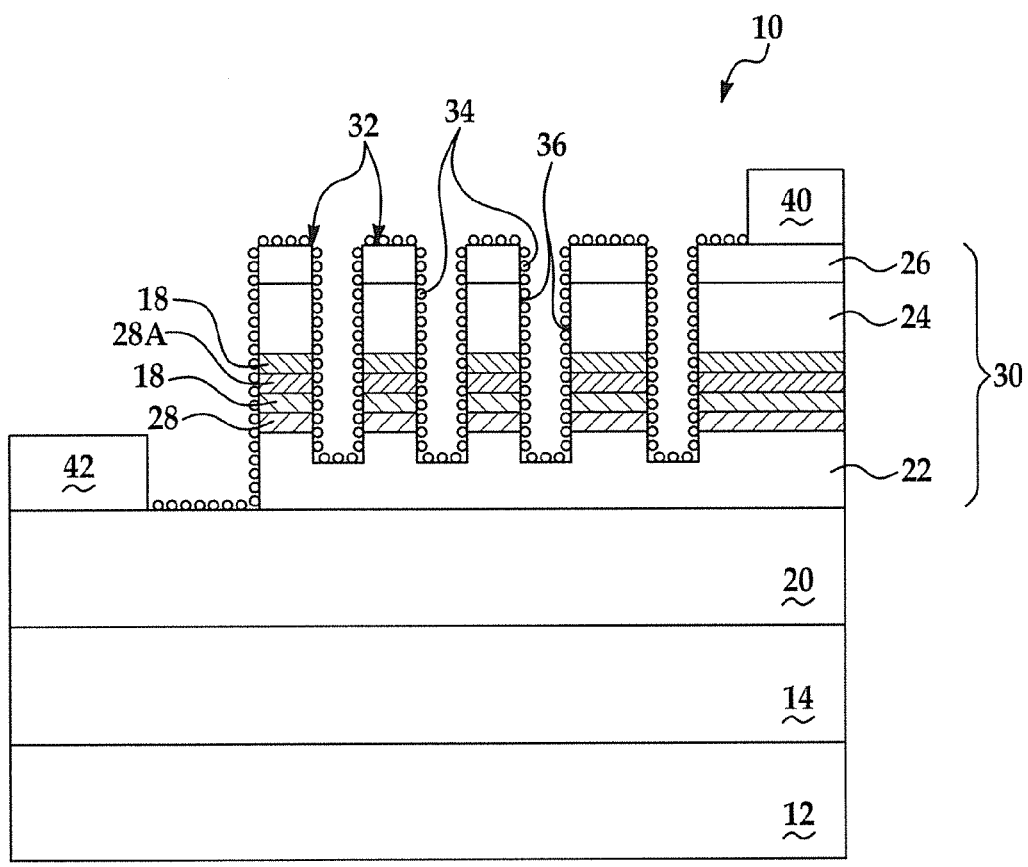
FIG. 1A is a cross-sectional schematic of an inventive LED.

The present invention has utility as an LED with superior performance relative to conventional LEDs. The present invention achieves superior performance through minimizing the separation distance between the quantum wells (QWs) of a nanopillar-configured LED structure and visible-light emissive quantum dots (QD). Through minimal separation, (QW)-(QD) nonradiative energy transfer from the QW to the QD (QW→QD) is promoted. Nonradiative energy transfer rate, $\gamma_{ET}^{-1}$, scales as $d^{-4}$ with the QD-QW distance.(1) However, the theoretical recognition that QD-QW separation should be minimal is in conflict with the requirement that an InGaN layer capable of nonradiative energy transfer requires a doped GaN overlayer to complete a p-i-n or n-i-p LED structure. QD-QW coupling through the side walls of the nanopillar-configured LED structure is employed to satisfy the requirements that were previously incompatible. Additionally, the present invention controls the geometric dimensions of the nanopillars as well as their separation distance to eliminate the total internal reflection for the enhanced light extraction efficiency. As the spectra emission from a QD is a both a size-dependent and composition-dependent property, the overall spectral emission from an LED is controlled in certain embodiments of the present invention to include QDs that have different spectral emission to produce LEDs with controlled and desirable colors. The collective QD band gaps are such that an emission discerned by a normal human eye as white in color is provided in certain inventive embodiments.

According to the present invention, a substrate supports an n-type doped semiconductor layer on which a multilayer intrinsic heterojunction is applied and overlaid with a p-type doped semiconductor on the top surface of the intrinsic region. This heterostructure is etched to form multiple nanopillars with the etch extending at least into the multilayer insulator and optionally through to the n-typed doped semiconductor layer. In contrast to prior art, shallow etched structures that merely etched the p-type doped semiconductor layer and then applied nano- and micro-particle phosphors thereto, the present invention promotes dipole-dipole nonradiative energy transfer between the quantum dots and quantum wells. The quantum wells are formed by sandwiching a narrow bandgap "semiconductor layer" between a pair of wide bandgap barrier layers. By adhering quantum dots on the side walls, and in particular contacting or proximal to the exposed quantum wells, a high-efficiency, tunable emission profile LED is achieved. It is appreciated that the relative ordering of n-type and p-type semiconductors are readily inverted to also achieve an operative device. While the present invention is further detailed with respect to an InGaN QW active element, it should be appreciated that other semiconductors are readily substituted in the nanopillared LEDs detailed herein. Other semiconductors operative herein illustratively include other bimetallic and trimetallic semiconductors based on aluminum nitride and gallium nitride.

Referring now to FIG. 1A, a schematic of an inventive LED is shown generally at 10. The LED 10 has elements built upon a substrate 12. A substrate operative in the present invention provides mechanical support for the active elements of an LED and is limited only by the requirements that the LED heterostructure can be lattice-matched or pseudomorphically grown over the substrate material. Substrate materials operative herein include sapphire, quartz, silicon, and silicon carbide. To promote the crystal quality of the LED heterostructure, an optional (In, Al, Ga)N buffer layer 14 is deposited intermediate therebetween. On top of the buffer layer, if present in a specific embodiment, is a standard p-i-n nitride LED structure shown generally at 30 with one or more InGaN QWs 18 embedded in the intrinsic region. A representative p-i-n LED structure includes from the bottom up in FIG. 1A, an ohmic contact layer of heavily doped n+ GaN 20, an n-type GaN layer 22, one or multiple InGaN/GaN quantum wells 18, a p-type GaN layer 24, and an ohmic contact layer of heavily doped p+ GaN cap layer 26. Preferably an inventive LED is based on gallium nitride for the various layers with quantum wells being formed from conventional emissive lattice matched semiconductors of indium gallium nitride (InGaN), aluminum gallium nitride (AlGaN), or aluminum gallium indium nitride (AlGaInN), and combinations thereof. It is appreciated that the relative fractions of aluminum nitride, indium nitride, or a combination thereof within gallium nitride to form a quantum well layer are readily varied as is conventional to the art. Indium gallium nitride quantum walls are known to be adjustable in light emission wavelengths from violet to amber based on composition while aluminum gallium nitride emissions extend from violet into the near ultraviolet of approximately 350 nanometers. It is appreciated that the magnitude of an energy transfer event through a nonradiative transfer mechanism is modified through selection of quantum well composition.

Upon forming a multilayer stack of layers 20-22-18-24-26 on substrate 12 with optional intermediate layers 28, and 28A, the stack is etched to form a nanopillar structure with the etch extending at least into contact with the quantum well layer 18. The intermediate layers 28 and 28A are in some embodiments intrinsic semiconductors such as GaN that clad the quantum well layer and have a band gap greater than the QW. In some inventive embodiments, the etch extends through the entire stack of the multilayer 30. Nanopillars 32 are formed by the etch have a mean linear dimension of between 50 nanometers and 1 micron.

As used herein, an average linear dimension is defined as an average of the maximal linear extent of two orthogonal axes as measured at the top surface of a nanopillar.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

While the formation of nanopillars 32 are right cylinders, with the x-axis and y-axis of approximately equivalent linear extents, it is appreciated that nanopillars 32 are also readily formed with rectilinear or oblong top surfaces.

The nanopillars 32 are then coated with quantum dot semiconductor nanocrystals (QDs) 34. Those QDs proximal to the quantum wells 18 exposed along side walls 36 are now capable of being emissively stimulated through a nonradiative energy transfer from the quantum well to the quantum dots. The other QDs 34 spatial removed from the QWs 18 provide limited emission, yet only those QDs 34 proximal to quantum wells 18 along side wall 36 emit with an efficiency superior to that of conventional LEDs. An inventive LED 10 is completed through inclusion of a p-type electrode 40 in electrical contact with p-type layer 26 and an n-type electrode 42 in electrical contact with heavily doped n+ GaN 20. Forming an electrical circuit between electrode 40 and electrode 42 with a power source having a voltage to induce spectral emission from said at least one quantum well produces emission from the QDs through non-radiative coupling to the QWs 18. The resultant LED 10 is amenable to conventional potting. The nature of the nanocrystals 34 applied to an inventive LED 10 is largely dependent upon the desired spectral wavelength output produced by the LED 10. In addition to uniform composition nanocrystals of II-VI, III-V, or IV semiconductors such as sulfides, selenides, or tellurides of transition metals; phosphides or arsenides of gallium or indium; or group IV silicon, core-shell nanocrystals are appreciated to provide greater control over photoluminescence spectral peaks from such core-shell nanocrystals. Additionally, it is appreciated that by adjusting the overall size of a core-shell nanocrystal QD, as well as the relative thickness of the core-shell layers, still greater control can be exerted over photoluminescence. As such, when the nanocrystals 31 are not homogenous, but rather vary in terms of composition, size and/or homogeneous versus core-shell structure, fine control is exerted over spectral emission from the resultant LED 10. It is appreciated that a like n-i-p LED structure is readily produced from convention LED materials with layer inversion around the QWs on the underlying substrate relative to that shown in FIG. 1A.

The present invention is further detailed with respect to an indium gallium nitride quantum well containing a nanopillared LED having cadmium selenide/cadmium sulfide coreshell nanocrystals applied thereto. These examples are merely exemplary of the present invention and should not be construed as limiting the structures or materials of an inventive LED with respect to the appended claims.

EXAMPLE 1

Fabrication of InGaN/GaN Based Nanopillar LEDs

High density InGaN/GaN based nanopillar LEDs were fabricated by using self-assembled tin oxide (TO) nanodots and dry etching the InGaN/GaN using the TO nanodots as a mask. The self-assembled TO nanodots were produced as follows. A $SiO_2$ layer was deposited on the top surface of the LED wafer using a plasma-enhanced chemical vapor deposition (PECVD) system, and then an indium tin oxide (ITO) layer was deposited onto the $SiO_2$ layer using an electron beam evaporator. The sample with the LED wafer/$SiO_2$/ITO layers was dipped into a solution containing HCl to etch away indium oxide clusters, which gave rise to self-assembled tin oxide clusters on the $SiO_2$ layer. The $SiO_2$ layer was then etched using the tin oxide clusters as an etching mask. After the patterning of the $SiO_2$ layer, the etching mask of the oxide clusters was removed using a chemical solution. Then, the LED wafer was dry-etched using the $SiO_2$ clusters as an etch mask. Finally, Ti/Al was deposited for the electrode on n-GaN.

EXAMPLE 2

Fabrication of QD Coated Nanopillar LEDs

Figure 1B:
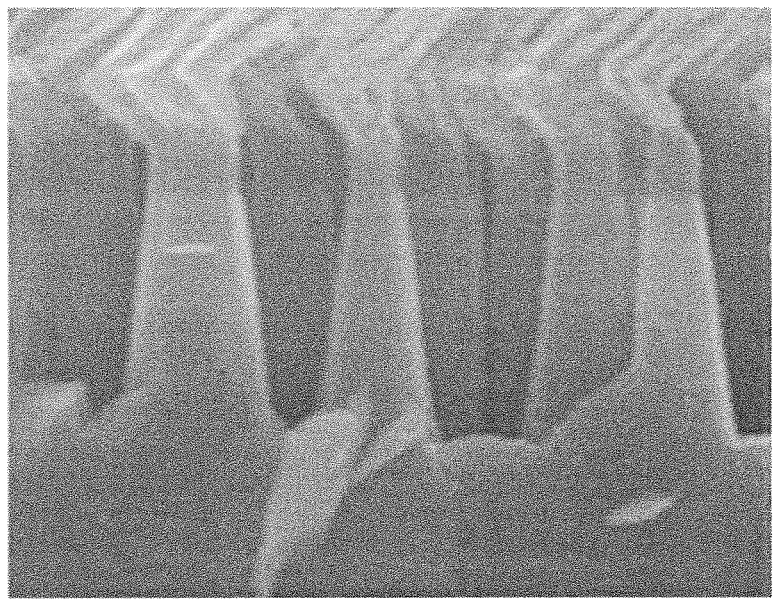
FIG. 1B is a cross-sectional scanning electron microscopy image of an inventive LED.
Figure 2A:
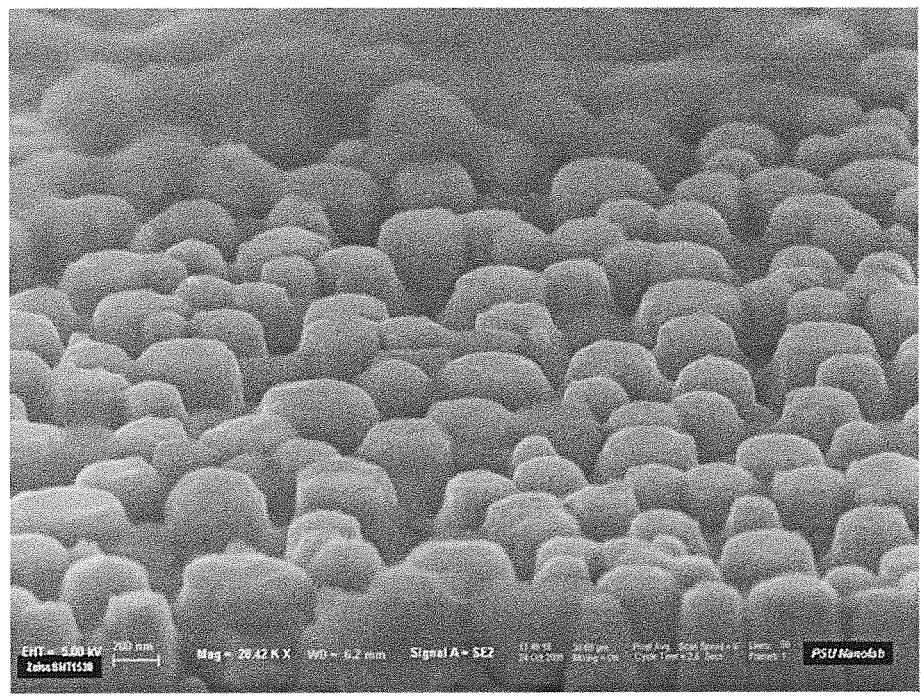
FIG. 2A is a field emission scanning electron micrograph (SEM) of an inventive LED.
Figure 2B:
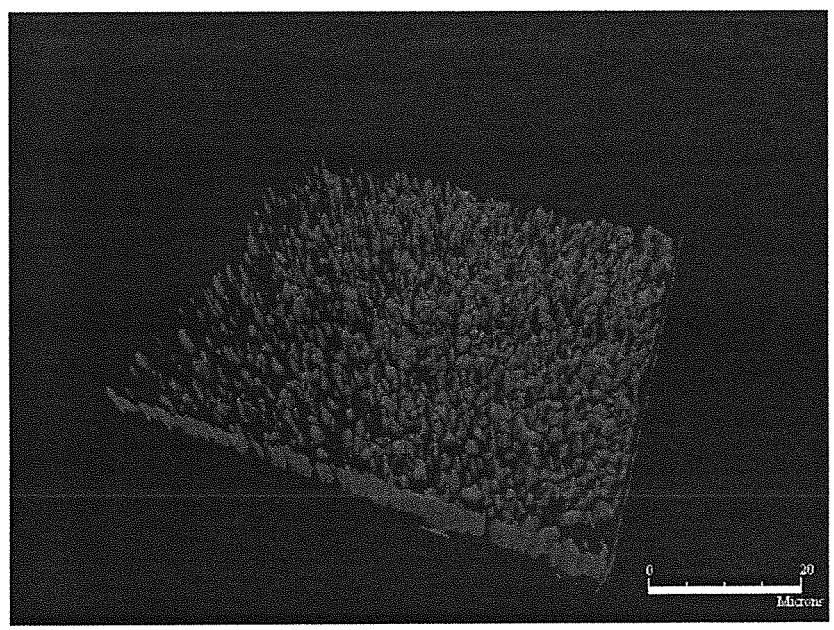
FIG. 2B is a Z scan confocal fluorescent microscope image of the QD coated nanopillar LED.

The InGaN/GaN MQW LED nanopillars were fabricated by the inductively coupled plasma (ICP) etching using self-assembled TO nanodots as the etching mask with the PL peak centered at 460 nm. By controlling the size of the TO nanodots and the ICP etching time, nanorods with a height of 500 nm and diameters ranging between 100 nm and 500 nm were fabricated successfully. A layer of CdSe/CdS core/shell QDs with the PL peak centered at 620 nm were coated over the nanopillar LED sample and subsequently annealed at 100° C. to remove the solvent. (The coating methods include soaking the nanopillar LED into the QD solution, spin-casting, drop-casting or mist deposition.) FIG. 1B is a cross sectional scanning electron microscopy image of the device so formed. FIG. 2A shows a field emission scanning electron microscopy (FESEM) image of a QD-coated nanopillar LED sample. FIG. 2B shows the z-scan 3D confocal fluorescent microscope image of the QD phosphors coated onto the nanopillars. A 488 nm CW laser was used as the pump source to selectively excite the PL emission from the QD phosphors. In addition, a narrow band pass filter (620/10 nm) was applied before the detector allowing only the emission from QD phosphors to pass through. A z-stack of fluorescence images was acquired with a z-step of 0.2 μm, and then deconvolved to rebuild the 3D fluorescence image of QD phosphors coated inside the nanopillar. Both images show strong evidence that QDs distributes into the nanopillar gaps and achieved direct contact with the InGaN/GaN MQW region.

EXAMPLE 3

Characterization of QD Coated Nanopillar LEDs

To study the direct MWQ to QD nonradiative energy transfer rate, time-resolved photoluminescence (TRPL) studies were performed for the InGaN nanorod LED structure of Example 1 with and without colloidal QD coating per Example 2. Two identical nanopillar LED samples with ~200 nm nanopillar diameter were used for the measurement. Both samples coated with and without QD phosphors were excited by the second harmonic ($\lambda$=400 nm) of a femtosecond light source (Libra, Coherent Inc., 70 fs pulse duration, 1 kHz repetition rate, 1 mJ pulse energy at $\lambda$=800 nm). The photoluminescence (PL) signal from the MQW region of the nanorods was collected by a photomultiplier by passing through a band pass filter (460/10 nm). The time resolution of the whole system was about 10 ps. All measurements were performed at room temperature.

Figure 3:
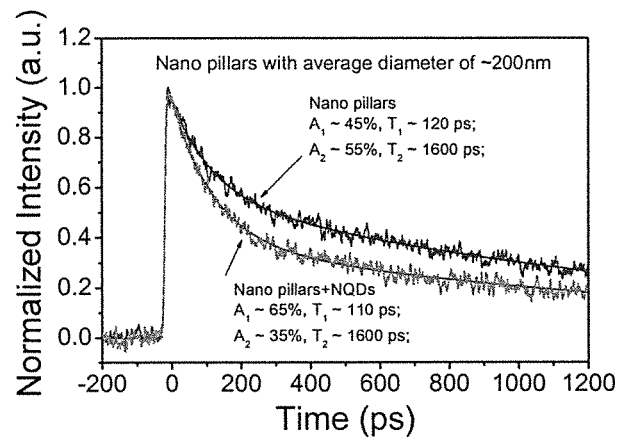
FIG. 3 is a plot of time resolved photoluminescence (TRPL) for a nanopillar LED structure having nanopillars with average diameter of ~200 nm sample coated with QDs (denoted as NQDs), and without QDs (nanopillars)

FIG. 3 shows the PL spectra of the two investigated nanorod LED samples coated with and without QD phosphors. The relaxation dynamics of nanopillar structures coated with and without QD phosphors can be well fitted by a biexponential function of $I(T)=A_1 \exp(-\alpha t)+A_2 \exp(-\beta t)$. The decay constants, $\alpha$ and $\beta$, are used to calculate the exciton lifetimes, $\tau_1=\alpha^{-1}$ and $\tau_2=\beta^{-1}$. All the measured parameters are summarized in Table 1. Without intending to be bound by a particular theory, for the nanopillar sample without the QD coating, the resolved fast process (45% of the overall signal) originates from the surface defects of the nanopillars formed during the plasma dry etching, while for the nanopillar samples coupled with the QDs, the resolved signal of the fast process (65% of the overall signal) are modeled as a combined result due to the nanopillar surface defects and the existence of MQW to QDs nonradiative energy transfer, which provides an additional relaxation channel for MQW excitations.

Figure 4:
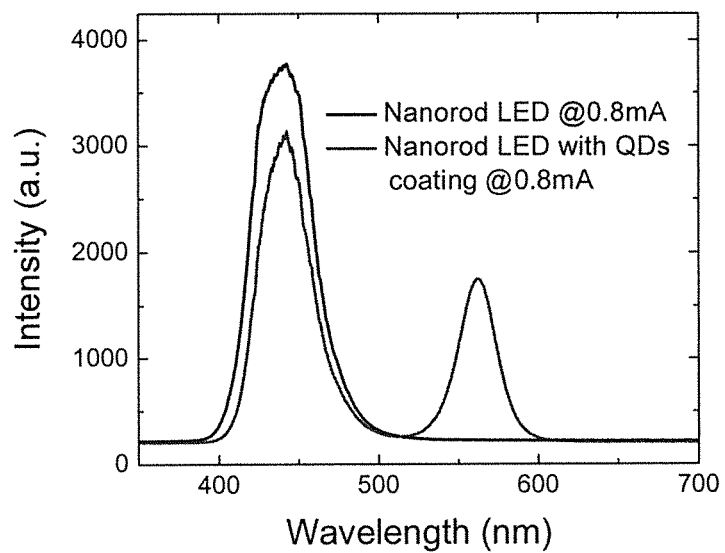
FIG. 4 shows electroluminescence plots for nanopillar LED structures with and without QD coupling.

FIG. 4 shows the electroluminescent spectra of the nanopillar with and without QD coupling, which indicates an overall 80% color conversion efficiency.

REFERENCES

[1] Marc Achermann, Melissa A. Petruska, Simon Kos, Darryl L. Smith, Daniel D. Koleske and Victor I. Klimov, "Energy-transfer pumping of semiconductor nanocrystals using an epitaxial quantum well", Nature, 429, 642-646 (2004).
[2] Hsueh-Shih Chen, Cheng-Kuo Hsu, and Hsin-Yen Hong, "InGaN—CdSe—ZnSe Quantum Dots White LEDs" IEEE Photon Tech. Lett. 18 (1) 193-195 (2006).
[3] Marc Achermann, Melissa A. Petruska, Daniel D. Koleske, Mary H. Crawford, and Victor I. Klimov, "Nanocrystal-Based Light-Emitting Diodes Utilizing High-Efficiency Nonradiative Energy Transfer for Color Conversion", Nano Lett., 6, 1396-1400 (2006).

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. A quantum well-based p-i-n light emitting diode comprising:
a substrate;
a first ohmic contact layer directly or indirectly layered on said substrate;
a first electrode in electrical communication with said first ohmic contact;
an n-type or p-type layer on said ohmic contact layer;
a plurality of nanopillars that have a mean nanopillar average linear dimension of between 50 nanometers and 1 micron and each of said plurality of nanopillars having a height, each of said plurality of nanopillars defined by a sidewall, at least one laminar semiconductor quantum well having a quantum well band gap existing along the height intermediate between an said n-type or p-type layer and an oppositely doped layer to said n-type or p-type layer;
a plurality of non-homogeneous core-shell quantum dot semiconductor nanoparticles contacting the sidewall proximal to the at least one laminar semiconductor quantum well, said non-homogeneous core-shell plurality of quantum dot semiconductor nanoparticles having band gaps that are less than or equal to the quantum well bandgap and vary in size and a relative thickness of core-shell layers;
a second ohmic contact layer directly or indirectly in electrical contact with said oppositely doped layer; and
a second electrode in electrical communication with said second ohmic contact and forming an electrical circuit with said first electrode.

2. The diode of claim 1 wherein said plurality of nanopillars are right cylinders.

3. The diode of claim 1 wherein said plurality of non-homogeneous core-shell quantum dot semiconductor nanocrystals comprise a II-VI semiconductor.

4. The diode of claim 1 wherein said plurality of non-homogeneous core-shell quantum dot semiconductor nanocrystals comprise core-shell nanocrystals with cadmium selenide cores with cadmium sulfide shells.

5. The diode of claim 1 wherein said plurality of nanopillars are etched through said at least one quantum well and said oppositely doped layer and said n-type or p-type layer.

6. The diode of claim 1 further comprising an intermediate layer in simultaneous contact between said first ohmic contact layer and said substrate.

7. The diode of claim 1 further comprising a power source having a voltage to induce spectral emission from said at least one quantum well.

8. The diode of claim 1 wherein said n-type or p-type layer is n-type and said oppositely doped layer is p-type.

9. The diode of claim 1 wherein the band gaps of said plurality of non-homogeneous core-shell quantum dot semiconductor nanocrystals collectively provide an emission discerned by a normal human eye as white in color.

10. The diode of claim 1 wherein the at least one laminar semiconductor quantum well is a plurality of quantum wells that are vertical displaced along the height of one of said plurality of nanopillars.

11. A light emitting diode comprising:
a substrate;
a first ohmic contact layer of n+ GaN directly or indirectly layered on said substrate;
a first n-type electrode in electrical communication with said first ohmic contact;
an n-type n-doped GaN layer on said ohmic contact layer;
a plurality of nanopillars that have a mean nanopillar average linear dimension of between 50 nanometers and 1 micron and each of said plurality of nanopillars having a height, each of said plurality of nanopillars defined by a sidewall, at least one InGaN quantum well existing along the height intermediate between an said n-type n-doped GaN layer and a p-type p-doped GaN doped layer;
a plurality of non-homogeneous core-shell quantum dot semiconductor nanoparticles contacting the sidewall proximal to the InGaN quantum well, said plurality of non-homogeneous core-shell quantum dot semiconductor nanoparticles having band gaps that are less than a band gap for the at least one InGaN quantum and vary in size and a relative thickness of core-shell layers;

a second ohmic contact layer of p+ GaN directly or indirectly in electrical contact with said p-type p-doped GaN doped layer; and a second electrode in electrical communication with said second ohmic contact and forming an electrical circuit with said first electrode.

12. The diode of claim 11 wherein said plurality of nanopillars are right cylinders.

13. The diode of claim 11 wherein said plurality of non-homogeneous core-shell quantum dot semiconductor nanocrystals comprise a II-VI semiconductor.

14. The diode of claim 11 wherein said plurality of non-homogeneous core-shell quantum dot semiconductor nanocrystals comprise core-shell nanocrystals with cadmium selenide cores with cadmium sulfide shells.

15. The diode of claim 11 wherein said plurality of nanopillars are etched through said at least InGaN quantum well and into said n-type n-doped GaN layer.

16. The diode of claim 11 further comprising an intermediate layer in simultaneous contact between said first ohmic contact layer of n+ GaN and said substrate.

17. The diode of claim 11 further comprising a power source having a voltage to induce spectral emission from said at least one quantum well.

18. The diode of claim 11 wherein the band gaps of said plurality of non-homogeneous core-shell quantum dot semiconductor nanocrystals collectively provide an emission discerned by a normal human eye as white in color.

19. The diode of claim 11 wherein the at least one laminar semiconductor quantum well is a plurality of quantum wells that are vertical displaced along the height of one of said plurality of nanopillars.

* * * * *